(12) United States Patent
Buchberger, Jr. et al.

(10) Patent No.: US 9,829,790 B2
(45) Date of Patent: Nov. 28, 2017

(54) IMMERSION FIELD GUIDED EXPOSURE AND POST-EXPOSURE BAKE PROCESS

(71) Applicant: Applied Materials, Inc., Santa Clara, CA (US)

(72) Inventors: Douglas A. Buchberger, Jr., Livermore, CA (US); Sang Ki Nam, Danville, CA (US); Viachslav Babayan, Sunnyvale, CA (US); Christine Y. Ouyang, Santa Clara, CA (US); Ludovic Godet, Sunnyvale, CA (US); Srinivas D. Nemani, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 115 days.

(21) Appl. No.: 14/733,923

(22) Filed: Jun. 8, 2015

(65) Prior Publication Data

US 2016/0357107 A1 Dec. 8, 2016

(51) Int. Cl.
*G03F 7/20* (2006.01)
*G03F 7/004* (2006.01)
*G03F 7/38* (2006.01)

(52) U.S. Cl.
CPC .............. *G03F 7/0045* (2013.01); *G03F 7/38* (2013.01); *G03F 7/70* (2013.01)

(58) Field of Classification Search
None
See application file for complete search history.

(56) References Cited

U.S. PATENT DOCUMENTS

| | | | |
|---|---|---|---|
| 5,158,861 A | 10/1992 | Tokui et al. | |
| 7,374,867 B2 | 5/2008 | Bristol et al. | |
| 2003/0008246 A1 | 1/2003 | Cheng et al. | |
| 2005/0074706 A1 | 4/2005 | Bristol et al. | |
| 2008/0008967 A1 | 1/2008 | Chang et al. | |
| 2010/0029093 A1* | 2/2010 | Shiozawa | H01J 37/32192 438/772 |
| 2010/0248152 A1* | 9/2010 | Scheer | H01L 21/0332 430/311 |
| 2012/0103939 A1 | 5/2012 | Wu et al. | |
| 2012/0322011 A1 | 12/2012 | Wu et al. | |

* cited by examiner

*Primary Examiner* — Steven H Whitesell Gordon
(74) *Attorney, Agent, or Firm* — Patterson + Sheridan, LLP

(57) ABSTRACT

Methods disclosed herein provide apparatus and method for applying an electric field and/or a magnetic field to a photoresist layer without air gap intervention during photolithography processes. In one embodiment, an apparatus includes a processing chamber comprising a substrate support having a substrate supporting surface, a heat source embedded in the substrate support configured to heat a substrate positioned on the substrate supporting surface, an electrode assembly configured to generate an electric field in a direction substantially perpendicular to the substrate supporting surface, wherein the electrode assembly is positioned opposite the substrate supporting surface having a downward surface facing the substrate supporting surface, wherein the electrode assembly is spaced apart from substrate support defining a processing volume between the electrode assembly and the substrate supporting surface, and a confinement ring disposed on an edge of the substrate support or the electrode assembly configured to retain an intermediate medium.

15 Claims, 9 Drawing Sheets

IMMERSION FIELD GUIDED EXPOSURE AND POST-EXPOSURE BAKE PROCESS

BACKGROUND

Field

The present disclosure generally relates to methods and apparatuses for processing a substrate, and more specifically to methods and apparatuses for improving photolithography processes.

Description of the Related Art

Integrated circuits have evolved into complex devices that can include millions of components (e.g., transistors, capacitors and resistors) on a single chip. Photolithography may be used to form components on a chip. Generally the process of photolithography involves a few basic stages. Initially, a photoresist layer is formed on a substrate. The photoresist layer may be formed by, for example, spin-coating. A chemically amplified photoresist may include a resist resin and a photoacid generator. The photoacid generator, upon exposure to electromagnetic radiation in the subsequent exposure stage, alters the solubility of the photoresist in the development process. The electromagnetic radiation may have any suitable wavelength, such as a wavelength in the extreme ultra violet region. The electromagnetic radiation may be from any suitable source, such as, for example, a 193 nm ArF laser, an electron beam, an ion beam, or other source. Excess solvent may then be removed in a pre-exposure bake process.

In an exposure stage, a photomask or reticle may be used to selectively expose certain regions of the substrate to electromagnetic radiation. Other exposure methods may be maskless exposure methods. Exposure to light may decompose the photo acid generator, which generates acid and results in a latent acid image in the resist resin. After exposure, the substrate may be heated in a post-exposure bake process. During the post-exposure bake process, the acid generated by the photoacid generator reacts with the resist resin, changing the solubility of the resist during the subsequent development process.

After the post-exposure bake, the substrate, and, particularly, the photoresist layer may be developed and rinsed. Depending on the type of photoresist used, regions of the substrate that were exposed to electromagnetic radiation may either be resistant to removal or more prone to removal. After development and rinsing, the pattern of the mask is transferred to the substrate using a wet or dry etch process.

The evolution of chip design continually requires faster circuitry and greater circuit density. The demands for greater circuit density necessitate a reduction in the dimensions of the integrated circuit components. As the dimensions of the integrated circuit components are reduced, more elements are required to be placed in a given area on a semiconductor integrated circuit. Accordingly, the lithography process must transfer even smaller features onto a substrate, and lithography must do so precisely, accurately, and without damage. In order to precisely and accurately transfer features onto a substrate, high resolution lithography may use a light source that provides radiation at small wavelengths. Small wavelengths help to reduce the minimum printable size on a substrate or wafer. However, small wavelength lithography suffers from problems, such as low through put, increased line edge roughness, and/or decreased resist sensitivity.

In a recent development, an electrode assembly is utilized to generate an electric field to a photoresist layer disposed on the substrate prior to or after an exposure process so as to modify chemical properties of a portion of the photoresist layer where the electromagnetic radiation is transmitted to for improving lithography exposure/development resolution. However, inaccurate field strength control of the electric field generated proximate to the photoresist layer may result in insufficient electric field energy transmitted to the photoresist layer for chemical property alternation. Furthermore, undesired voltage drop between the substrate and the electrode assembly resulting from transmitting from different intermittent medium therebetween may also affect the electric field strength generated to the photoresist layer disposed on the substrate.

Therefore, there is a need for a method and an apparatus for improving photolithography processes with improved control of electric field generation generated to a photoresist layer.

SUMMARY

Disclosed herein are apparatus and methods for applying an electric field and/or a magnetic field to a photoresist layer without air gap intervention during photolithography processes. In one embodiment, an apparatus includes a processing chamber comprising a substrate support having a substrate supporting surface, a heat source embedded in the substrate support configured to heat a substrate positioned on the substrate supporting surface, an electrode assembly configured to generate an electric field in a direction substantially perpendicular to the substrate supporting surface, wherein the electrode assembly is positioned opposite the substrate supporting surface having a downward surface facing the substrate supporting surface, wherein the electrode assembly is spaced apart from substrate support defining a processing volume between the electrode assembly and the substrate supporting surface, and a confinement ring disposed on an edge of the substrate support or the electrode assembly configured to retain an intermediate medium.

In another embodiment, a processing chamber includes a substrate support comprising a substrate supporting surface, an electrode assembly comprising a first electrode disposed in the substrate support and a second electrode positioned opposite the substrate supporting surface, the first and the second electrodes defining a processing volume inbetween configured to generate an electric field in a direction substantially perpendicular to the substrate supporting surface, and an intermediate medium positioned in the processing volume.

In yet another embodiment, a method of processing a substrate, the method includes exposing portions of a photoresist layer disposed on a substrate to electromagnetic radiation to generate charged species from photoacid generator in the photoresist layer and to form substantially parallel lines of material in the photoresist layer having different chemical properties than the portions of the photoresist layer not exposed to the electromagnetic radiation, immersing the photoresist layer in a non-gas phase intermediate medium without exposure to air, and applying an electric field to the photoresist layer while immersing the photoresist layer in the intermediate medium.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, wherever possible, to designate identical elements that are common to the Figures. Additionally, elements of one embodiment may be advantageously adapted for utilization in other embodiments described herein.

DETAILED DESCRIPTION

Methods and apparatuses for minimizing line edge/width roughness and improving exposure resolution in a photolithography process for semiconductor applications are provided. The methods and apparatuses disclosed herein may increase the photoresist sensitivity and productivity of photolithography processes. The random diffusion of charged species generated by a photoacid generator during a post-exposure bake procedure contributes to line edge/width roughness and reduced resist sensitivity. An electrode assembly may be utilized to apply an electric field and/or a magnetic field to the photoresist layer during photolithography processes. The field application may control the diffusion of the charged species generated by the photoacid generator. Furthermore, an intermediate medium is utilized between the photoresist layer and the electrode assembly so as to enhance the electric field generated therebetween. An air gap defined between the photoresist layer and the electrode assembly may result in voltage drop applied to the electrode assembly, thus, adversely lowering the level of the electric field desired to be generated to the photoresist layer. Inaccurate level of the electric field at the photoresist layer may result in insufficient or inaccurate voltage power to drive or create charged species in the photoresist layer in certain desired directions, thus leading to diminished line edge profile control to the photoresist layer. Thus, an intermediate medium is placed between the photoresist layer and the electrode assembly to prevent an air gap from being created therebetween so as to maintain the level of the electric field interacting with the photoresist layer at a certain desired level. By doing so, the charged species generated by the electric field may be guided in a desired direction along the line and spacing direction, preventing the line edge/width roughness that results from inaccurate and random diffusion. Thus, a controlled or desired level of electric field as generated may increase the accuracy and sensitivity of the photoresist layer to exposure and/or development process. In one example, the intermediate medium may be non-gas phase medium, such as a slurry, gel, liquid solution or a solid state medium that may efficient maintain voltage level as applied at a determined range when transmitting from the electrode assembly to the photoresist layer disposed on the substrate.

Figure 1:
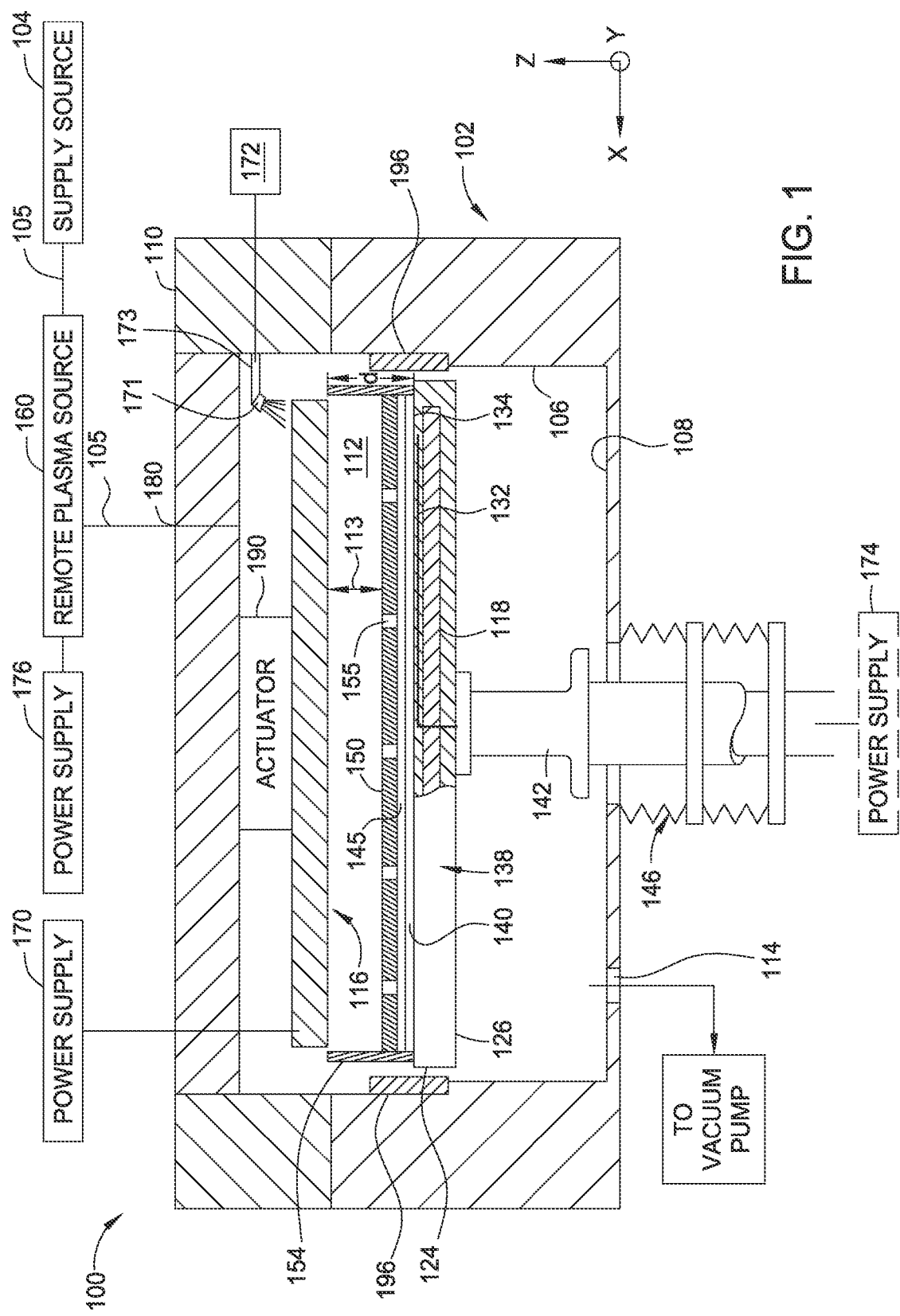
FIG. 1 is a schematic cross-sectional view of an apparatus for processing a substrate, according to one embodiment.

FIG. 1 is a schematic cross-sectional view of an apparatus for processing a substrate, according to one embodiment. As shown in the embodiment of FIG. 1, the apparatus may be in the form of a vacuum processing chamber 100. In other embodiments, the processing chamber 100 may not be coupled to a vacuum source. The processing chamber 100 may be an independent processing chamber. Alternatively, the processing chamber 100 may be part of a processing system, such as, for example, an in-line processing system, a cluster processing system, or the track processing system shown in FIG. 6 (discussed below).

The processing chamber 100 includes chamber walls 102, an electrode assembly 116, and a substrate support assembly 138. The chamber walls 102 include sidewalls 106, a lid assembly 110, and a bottom 108. The chamber walls 102 at least partially enclose a processing volume 112. The processing volume 112 is accessed through a substrate transfer port (not shown) configured to facilitate movement of a substrate 140 into and out of the processing chamber 100. In embodiments where the processing chamber 100 is part of a processing system, the substrate transfer port may allow for the substrate 140 to be transferred to and from a transfer chamber.

A pumping port 114 may optionally be disposed through one of the lid assembly 110, sidewalls 106 or bottom 108 of the processing chamber 100 to couple the processing volume 112 to an exhaust port. The exhaust port couples the pumping port 114 to various vacuum pumping components, such as a vacuum pump. The pumping components may reduce the pressure of the processing volume 112 and exhaust any gases and/or process by-products out of the processing chamber 100.

The substrate support assembly 138 is centrally disposed within the processing chamber 100. The substrate support assembly 138 supports the substrate 140 during processing. The substrate support assembly 138 may comprise a body 124 that encapsulates an optional electrode assembly 118 (described in FIG. 3). The body 124 may comprise, for example, a metal, such as aluminum, or a ceramic. In embodiments where the body 124 comprises a metal, the electrode assembly 118 may be encapsulated within an insulating material (not shown) that insulates the electrode assembly 118 from the metal body 124. The electrode assembly 118 may be coupled to the power supply 174. In other embodiments, the electrode assembly 118 may be coupled to a ground. In some embodiments, the electrode assembly 118 is configured to generate an electric field parallel to the x-y plane defined by the first surface 134 of the substrate support assembly 138. For example, the electrode assembly 118 may be configured to generate an electric field in one of the y direction, x direction or other direction in the x-y plane. In other embodiments, the electrode assembly 118 is configured to generate an electric field perpendicular to the x-y plane defined by the first surface 134 of the substrate support assembly 138.

Generally, the substrate support assembly 138 has the first surface 134 and a second surface 126. The first surface 134 is opposite the second surface 126. The first surface 134 is configured to support the substrate 140. The second surface 126 has a stem 142 coupled thereto. The substrate 140 is positioned on the first surface 134 of the substrate support assembly 138. The substrate 140 may be any type of substrate, such as a dielectric substrate, a glass substrate, a semiconductor substrate, or a conductive substrate. The substrate 140 may have a layer 145 disposed thereon. The layer 145 may be any desired layer. In some embodiments, the substrate 140 may have more than one layer 145. The substrate 140 also has a photoresist layer 150 disposed over the layer 145. The substrate 140 has been previously exposed to electromagnetic radiation in an exposure stage of a photolithography process. The photoresist layer 150 has latent image lines 155 formed therein from the exposure stage. The latent image lines 155 may be substantially parallel. In other embodiments, the latent image lines 155 may not be substantially parallel.

In some embodiments, the substrate support assembly 138 may be an electrostatic chuck. In some embodiments, the body 124 of the substrate support assembly 138 may encapsulate an embedded heater 132. The embedded heater 132, such as a resistive element, is disposed in the substrate support assembly 138. The embedded heater 132 controllably heats the substrate support assembly 138 and the substrate 140 positioned thereon to a predetermined temperature. The embedded heater 132 is configured to quickly ramp the temperature of the substrate 140 and to control the temperature of the substrate 140. In some embodiments, the embedded heater 132 is connected to and controlled by the power supply 174. The power supply 174 may be configured similarly to the power supply 170, discussed below.

In some embodiments, the processing chamber 100 may include other heating sources. For example, heat lamps may be positioned within or outside the processing chamber 100. In some embodiments, one or more lasers may be used to heat the photoresist layer 150 (or other layer) positioned on the substrate 140 or the antennas 220, 221 of the electrode assembly 116 (shown in FIG. 2). In some embodiments, the substrate support assembly 138 may be configured to circulate a high efficiency heat transfer fluid in order to more quickly increase the temperature of the substrate 140 positioned on the substrate support assembly 138.

In some embodiments, the substrate support assembly 138 may be configured to provide relative motion between the first surface 134 (and the substrate 140 positioned thereon) and the electrode assembly 116. For example, the substrate support assembly 138 may be configured to rotate about the z-axis. The substrate support assembly 138 may be configured to continuously or constantly rotate, or the substrate support assembly 138 may be configured to rotate in a step manner. For example, the substrate support assembly 138 may rotate a predetermined amount, such as 90°, 180°, or 270°, and then rotation may stop for a predetermined amount of time. After the predetermined amount of time, the rotation may continue in a step manner or in a continuous manner.

The substrate support assembly 138 may be configured to move vertically (i.e.) in the z-direction. The substrate support assembly 138 may be separated from the electrode assembly 116. For example, the substrate support assembly 138 and the electrode assembly 116 may be separated by a distance of at least about 0.1 mm. A confinement ring 154 is disposed on an edge of the substrate support assembly 138 circumscribing the substrate support assembly 138 defining a distance d in the z-direction between the first surface 134 of the substrate support assembly 138 and the electrode assembly 116. The confinement ring 154 may assist maintaining the substrate 140 positioned at a desired place on the first surface 134 of the substrate support assembly 138. Furthermore, the confinement ring 154 may also confine an intermediate medium, i.e., a non-gas phase medium, such as solid slurry, a gel and/or liquid medium positioned, in the processing volume 112 above the photoresist layer 150 in place. In one example, the confinement ring 154 may have a length, i.e., the defined distance d, between about 0.5 mm and about 10 mm, sufficient to retain the intermediate medium, e.g., substances and/or liquid medium, at a level that covers an entire surface of the photoresist layer 150 disposed on the substrate 140 when the intermediate medium is disposed in the processing volume 112. Alternatively, the confinement ring may be disposed on an edge of the electrode assembly 116, extending downwardly toward an edge of the substrate support assembly 138 to assist guiding the substrate 140 in a desired position. In one example, the confinement ring 154 may be manufactured by a ceramic material, conductive material, dielectric material or other suitable material that are chemically inert to the intermediate medium positioned in the processing volume 112.

In one example, an intermediate medium dispensing tool 173 is disposed in the processing chamber 100 through the chamber walls 102. The intermediate medium dispensing tool 173 includes a nozzle 171 coupled thereto configured to dispense intermediate medium to the processing volume 112 confined by the confinement ring 154 above the substrate 140. The intermediate medium dispensing tool 173 is coupled to an intermediate medium source 172, which provides the intermediate medium to the processing volume 112. Suitable examples of the intermediate medium includes any suitable liquid, such as water, organic gel, resin, inorganic solution, inorganic gel, slurry, or the like, or any solid material that may be easily melt and later re-solidify to cover substantially an entire surface of the substrate 140. Details regarding the intermediate medium that may be used will be described later with reference to FIGS. 4A-5B.

The stem 142 is coupled to a lift system (not shown) for moving the substrate support assembly 138 between an elevated processing position (as shown) and a lowered substrate transfer position. The lift system may control the position of the substrate 140 in the z-direction. In some embodiments, the lift system may also be configured to move the substrate 140 in the x-direction, the y-direction, or the x-direction and the y-direction. The stem 142 additionally provides a conduit for electrical and thermocouple leads between the substrate support assembly 138 and other components of the processing chamber 100. A bellows 146 is coupled to the substrate support assembly 138 to provide a vacuum seal between the processing volume 112 and the atmosphere outside the processing chamber 100 and facilitate movement of the substrate support assembly 138 in the z-direction.

The lid assembly 110 may optionally include an inlet 180 through which gases provided by the supply sources 104 may enter the processing chamber 100. The supply sources 104 may optionally controllably pressurize the processing volume 112 with a gas, such as nitrogen, argon, helium, hydrogen, neon, chlorine, other gases, or combinations thereof. The gases from the supply sources 104 may create a controlled environment within the processing chamber 100. In other embodiments, the gases from the supply sources 104 may be used to generate a plasma. For example, the plasma may be generated in a remote plasma source 160.

The supply sources 104 may couple directly to the processing volume 112 through a supply conduit 105. In some embodiments, such as shown, the one or more source compounds may indirectly flow into the processing volume 112. As shown, the one or more source compounds first flow through the remote plasma source 160 before flowing into the processing volume 112.

The remote plasma source 160 may be configured to provide charged species, such as electrons, into the processing volume 112. The remote plasma source may be, for example, a capacitively coupled plasma source or an inductively coupled source. The remote plasma source 160 is coupled to a power supply 176. The power supply 176 may be, for example, an RF power supply. The power supply 176 may be configured to deliver power at a frequency of 10 Hz and about 1 MHz, such as about 5 kHz. In other embodiments, the power supply 176 may be configured to deliver power at 13.56 MHz. The power supply 176 and the remote plasma source 160 may be configured to generate a "soft" plasma. For example, the generated plasma may contain charged species having an ion energy of between about 1 eV and about 1000 eV, such as between about 5 eV and about 50 eV. In some embodiments, the ion energy may be between about 1 eV and about 5 eV. Electrons in the soft plasma may be used to drive the charged species 255 (shown in FIGS. 2A and 2B) generated from the photoacid generator in the direction perpendicular to the plane of the first surface 134. Driving the charged species in the z-direction may increase resist sensitivity.

In a representative example using a 300 mm substrate, the soft plasma may be generated as follows. It is contemplated that the gas flows may be scaled proportionately to the substrate diameter. Hydrogen gas may be provided into the remote plasma source 160 at a flow rate of between about 10 sccm and about 1000 sccm. Argon may optionally be flowed into the remote plasma source 160 at a flow rate of up to about 1000 sccm. A plasma may be generated in an inductively coupled remote plasma source 160 from an RF power of between about 400 W and about 800 W. The pressure of the processing volume 112 may reduced to at least $10^{-5}$ Torr. For example, the pressure may be reduced to between about $10^{-6}$ Torr and about $10^{-8}$ Torr. The temperature of the substrate support assembly 138 may be maintained from room temperature to about 200° C., such as between about 70° C. and about 160° C., for example between about 90° C. and 140° C. as needed.

An actuator 190 may be coupled between the lid assembly 110 and the electrode assembly 116 to provide relative motion between the electrode assembly 116 and the substrate support assembly 138. The actuator 190 may be configured to move the electrode assembly 116 in one or more of the x, y, and z directions. The x and y directions are referred to herein as the lateral directions or dimensions. The actuator 190 enables the electrode assembly 116 to scan the surface of the substrate 140. The actuator 190 also enables the distance d to be adjusted. In some embodiments the electrode assembly 116 is coupled to the lid assembly 110 by a fixed stem (not shown). In some embodiments, the actuator 190 is configured to rotate the electrode assembly 116 about z-axis. In other embodiments, the electrode assembly 116 may be coupled to the inside of the bottom 108 of the processing chamber 100, to the second surface 126 of the substrate support assembly 138, or to the stem 142.

The electrode assembly 116 includes one or more electrodes. The electrode assembly 116 is coupled to the power supply 170. In embodiments where the electrode assembly 116 includes more than one electrode, each electrode may be connected to a power supply. In some embodiments, the electrode assembly 116 is configured to generate an electric field parallel to the x-y plane defined by the first surface 134 of the substrate support assembly 138. For example, the electrode assembly 116 may be configured to generate an electric field in one of the y direction, x direction or other direction in the x-y plane. In one embodiment, the electrode assembly 116 is configured to generate an electric field in the x-y plane and in the direction of the latent image lines 155. In another embodiment, the electrode assembly 116 is configured to generate an electric field in the x-y plane and perpendicular to the direction of the latent image lines 155. The electrode assembly 116 may additionally or alternatively be configured to generate an electric field in the z-direction, such as, for example, perpendicular to the first surface 134.

The power supply 170 and/or the power supply 174 may be configured to supply, for example, between about 500 V and about 100 kV to one or more electrodes of the electrode assembly 116 and/or the electrode assembly 118. In some embodiments, the power supply 170 and/or the power supply 174 are a continuous or pulsed direct current (DC) power supply or a continuous or pulsed AC power. The pulsed DC wave or AC wave may be from a half-wave rectifier or a full-wave rectifier. The power supply 170 and/or the power supply 174 may be configured to provide power at a frequency of between about 10 Hz and about 1 MHz, such as about 5 kHz. The duty cycle of the pulsed DC power or AC power may be between about 5% and about 95%, such as between about 20% and about 60%. In some embodiments, the duty cycle of the pulsed DC power or AC power may be between about 20% and about 40%. In other embodiments, the duty cycle of the pulsed DC power or AC power may be about 60%. The rise and fall time of the pulsed DC power or AC power may be between about 1 ns and about 1000 ns, such as between about 10 ns and about 500 ns. In other embodiments, the rise and fall time of the pulsed DC power or AC power may be between about 10 ns and about 100 ns. In some embodiments, the rise and fall time of the pulsed DC power or AC power may be about 500 ns. In some embodiments, the power supply 170 and/or the power supply 174 is an alternating current power supply. In other embodiments, the power supply 170 and/or the power supply 174 is a direct current power supply.

As shown, the electrode assembly 116 spans approximately the width of the substrate support assembly 138. In other embodiments, the width of the electrode assembly 116 may be less than that of the substrate support assembly 138. For example, the electrode assembly 116 may span between about 10% to about 80%, such as about 20% and about 40%, the width of the substrate support assembly 138. In embodiments where the width of the electrode assembly 116 is shorter than the width of the substrate support assembly 138, the actuator 190 may scan the electrode assembly 116 across the surface of the substrate 140 positioned on the first surface 134 of the substrate support assembly 138. For example, the actuator 190 may scan such that the electrode assembly 116 scans the entire surface of the substrate 140. In other embodiments, the actuator 190 may scan only certain portions of the substrate 140. Alternatively, the substrate support assembly 138 may scan underneath the electrode assembly 116.

In some embodiments, one or more magnets 196 may be positioned in the processing chamber 100. In the embodiment shown in FIG. 1, the magnets 196 are coupled to the inside surface of the sidewalls 106. In other embodiments, the magnets 196 may be positioned in other locations within the processing chamber 100 or outside the processing chamber 100. For example, the magnets 196 may be positioned within the processing chamber 100 and adjacent to the bottom 108 and/or the lid assembly 110. The magnets 196 may be, for example, permanent magnets or electromagnets. Representative permanent magnets include ceramic magnets and rare earth magnets. In embodiments where the magnets 196 include electromagnets, the magnets 196 may be coupled to a power supply (not shown). The magnets 196 are configured to generate a magnetic field in a parallel direction, a perpendicular direction, or other direction relative to the electric field generated by electrode assembly 116 and/or the electrode assembly 118. The magnets 196 may be configured to generate a field strength across the first surface 134 of between about 0.1 Tesla (T) and about 10 T, such as between about 1 T and about 5 T. In embodiments including a magnetic field, the magnets 196 may remain stationary or move relative to the first surface 134.

Figure 2:
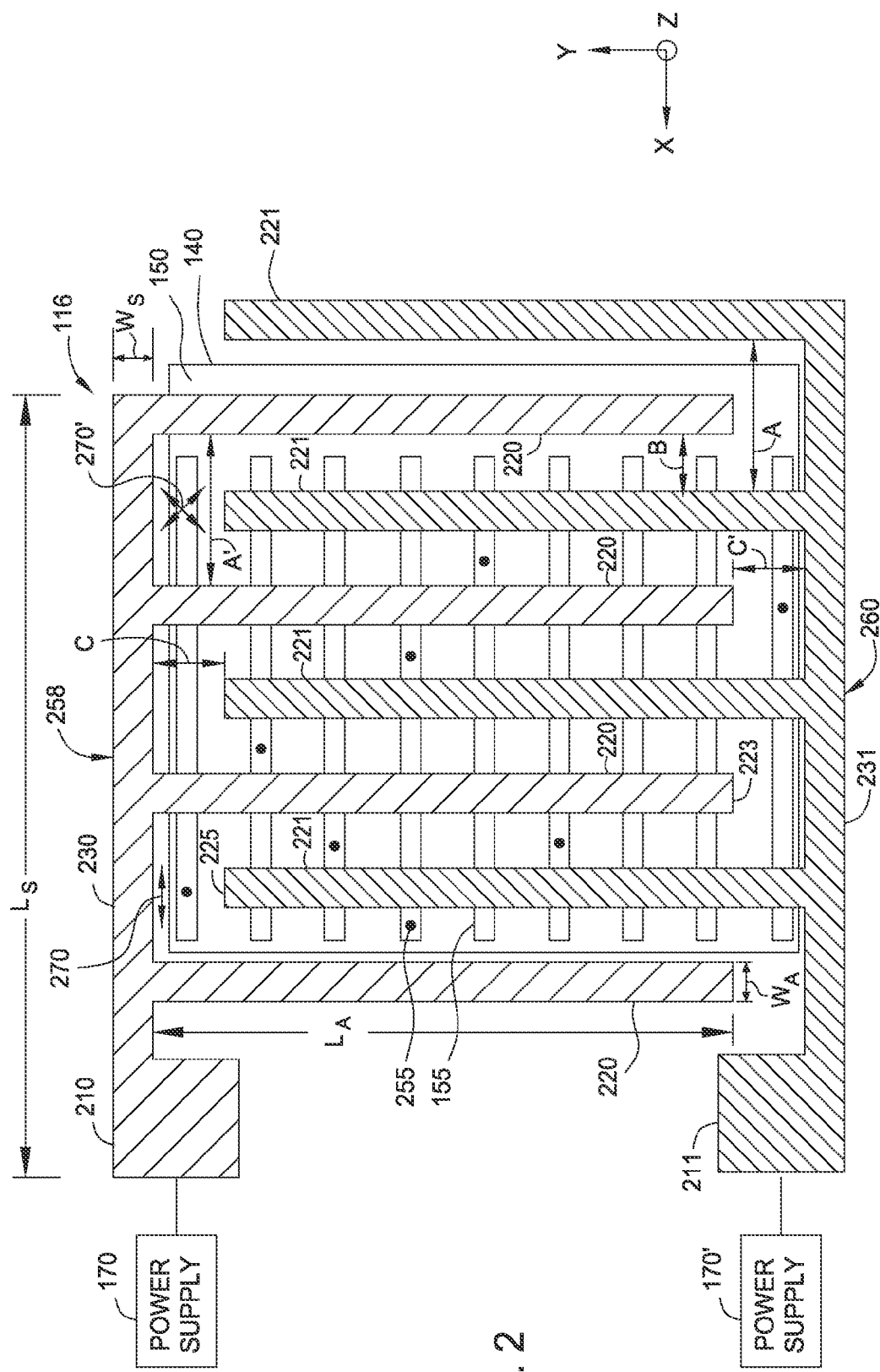
FIG. 2 is a top view of embodiment of an electrode assembly of apparatus of FIG. 1.

FIG. 2 is a top view of embodiments of the electrode assembly 116 of FIG. 1. In the embodiment shown in FIG. 2, the electrode assembly 116 includes at least a first electrode 258 and a second electrode 260. The first electrode 258 includes a first terminal 210, a support structure 230, and one or more antennas 220. The second electrode 260 includes a second terminal 211, a support structure 230, and one or more antennas 221. The first terminal 210, the support structure 230, and the one or more antennas 220 of the first electrode 258 may form a unitary body. Alternatively, the first electrode 258 may include separate portions that may be coupled together. For example, the one or more antennas 220 may be detachable from the support structure 230. The second electrode 260 may similarly be a unitary body or be comprised of separate detachable components. The first electrode 258 and the second electrode 260 may be prepared by any suitable methods. For example, the first electrode 258 and the second electrode 260 may be fabricated by machining, casting, or additive manufacturing.

The support structure 230 may be made from a conductive material, such as metal. For example, the support structure 230 may be made of one or more of silicon, polysilicon, silicon carbide, molybdenum, aluminum, copper, graphite, silver, platinum, gold, palladium, zinc, other materials, or mixtures thereof. The support structure 230 may have any desired dimensions. For example, the length $L_S$ of the support structure 230 may be between about 25 mm and about 450 mm, for example, between about 100 mm and about 300 mm. In some embodiments, the support structure 230 has a length $L_S$ approximately equal to a diameter of a standard semiconductor substrate. In other embodiments, the support structure 230 has a length $L_S$ that is larger or smaller than the diameter of a standard semiconductor substrate. For example, in different representative embodiments, the length $L_S$ of the support structure 230 may be about 25 mm, about 51 mm, about 76 mm, about 100 mm, about 150 mm, about 200 mm, about 300 mm, or about 450 mm. The width $W_S$ of the support structure 230 may be between about 2 mm and about 25 mm. In other embodiments, the width $W_S$ of the support structure 230 is less than about 2 mm or greater than about 25 mm. The thickness of the support structure 230 may be between about 1 mm and about 10 mm, such as between about 2 mm and about 8 mm, such as about 5 mm. In other embodiments the support structure may have a thickness of less than about 1 mm or greater than about 10 mm. In some embodiments, the support structure 230 may have a cross-section that is square, cylindrical, rectangular, oval, rods, or other shapes. Embodiments having round exterior surfaces may avoid arcing.

The support structure 231 may be made of the same materials as the support structure 230. The support structure 230 and the support structure 231 are made of different materials. The lengths $L_S$, widths $W_S$, and thicknesses of the support structure 230 and the support structure 231 may be the same or different. The one or more antennas 220 of the first electrode 258 may also be made from a conductive material. The one or more antennas 220 may be made from the same materials as the support structure 230. Each of the antennas 220 may have the same dimensions. Alternatively, some of the one or more antennas 220 may have different dimensions than one or more of the other antennas 220. The antennas 221 may be made of the same range of materials as the antennas 220. The range of dimensions suitable for the antennas 220 is also suitable for the antennas 221.

The number of the antennas 220 may be between about 1 and about 40 antennas. For example, the number of the antennas 220 may include between about 4 and about 40, such as between about 10 and about 20. Each of the antennas 220 may be substantially parallel to each of the other antennas 220. Each of the antennas 221 may be similarly positioned with respect to the support structure 231 and each other antenna 221. In one example, the support structure 230 and the support structure 231 are straight. In other example, the support structure 230 and the support structure 231 may not be straight, such as curved, jagged, or have other profiles or shapes. In these embodiments, each of the antennas 220 may still be substantially parallel to each of the other antennas 220.

Each of the antennas 220 has a terminal end 223. Each of the antennas 221 has a terminal end 225. A distance C is defined between the support structure 230 and the terminal end 225. A distance C' is defined between the support structure 231 and the terminal end 223. Each of the distances C and C' may be between about 1 mm and about 10 mm. A distance A is defined between facing surfaces of one of the antennas 221 and an adjacent one of the antennas 221. The distance A' is defined between facing surfaces of one antenna 220 and an adjacent one the antennas 220. The distances A and A' may be greater than about 6 mm. A distance B is defined between facing surfaces of one of the antennas 220 and an adjacent one of the antennas 221. The distance B may be, for example, greater than about 1 mm. The strength of an electric field generated between an antenna 220 and an adjacent antenna correlates with the distance B. For example, a smaller distance B correlates with a stronger electric field. Accordingly, in embodiments where a stronger electric field is desired, a smaller distance B may be advantageous.

In operation, the power supply 170 may supply a voltage to the first terminal 210 and/or a power supply 170' may provide a voltage to the second terminal 211. The power supply 170' may be substantially similar to the power supply 170. The supplied voltage creates an electric field between each antenna of the one or more antennas 220 and each antenna of the one or more antennas 221. The electric field will be strongest between an antenna of the one or more antennas 220 and an adjacent antenna of the one or more antennas 221. The interleaved and aligned spatial relationship of the antennas 220, 221 produces an electric field in a direction parallel to the plane defined by the first surface 134. The substrate 140 is positioned on the first surface 134 such that the latent image lines 155 are parallel to the electric field lines generated by the electrode assembly 116. Since the charged species 255 are charged, the charged species 255 are affected by the electric field. The electric field drives the charged species 255 generated by the photoacid generators in the photoresist layer 150 in the direction of the electric field. By driving the charged species 255 in a direction parallel with the latent image lines 155, line edge roughness may be reduced. The uniform directional movement is shown by the double headed arrow 270. In contrast, when a voltage is not applied to the first terminal 210 or the second terminal 211, an electric field is not created to drive the charged species 255 in any particular direction. As a result, the charged species 255 may move randomly, as shown by the arrows 270'. In other embodiments, the substrate 140 may be oriented differently relative to the antennas 220, 221. For example, the antennas 220, 221 may be parallel to the latent image lines 155.

Figure 3:
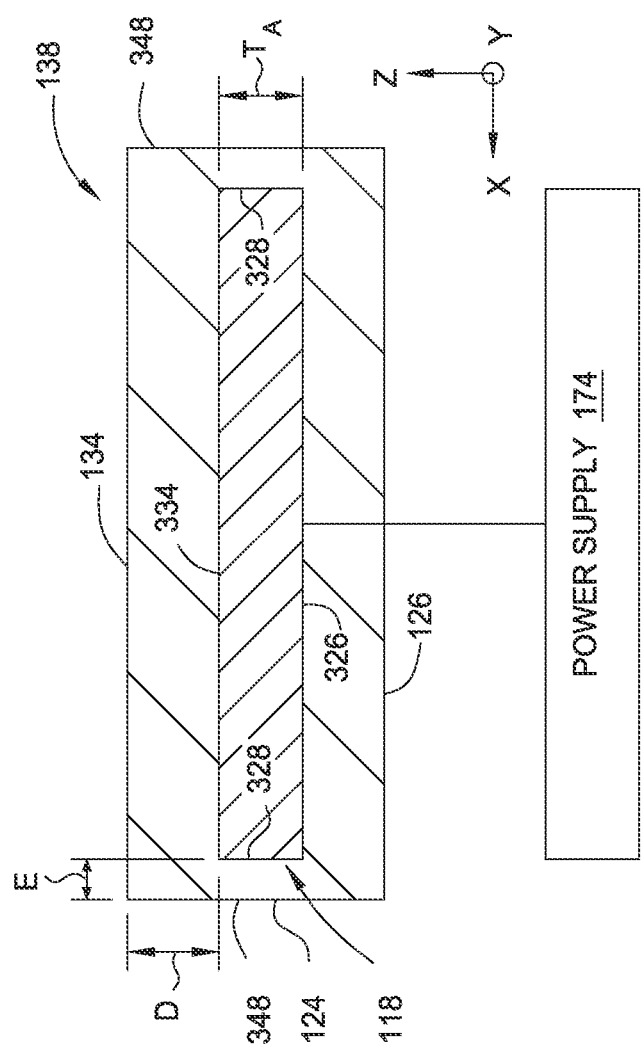
FIG. 3 is schematic side cross-sectional views of one embodiment of a substrate support assembly of the apparatus of FIG. 1 having one embodiment of an electrode assembly embedded therein.

FIG. 3 are schematic side cross-sectional view of an embodiment of the substrate support assembly 138 of FIG. 1 having one embodiment of the electrode assembly 118 embedded therein. The electrode assembly 118 is embedded between the first surface 134 and the second surface 126 of the body 124. The electrode assembly 118 has a first surface 334 and a second surface 326. The first surface 334 and the second surface 326 are opposite each other and substantially parallel to the first surface 134 of the substrate support assembly. The first surface 334 of the electrode assembly 118 is closer than the second surface 326 to the first surface 134 of the substrate support assembly 138. The distance D represents the distance separating the first surface 134 of the substrate support assembly 138 from the first surface 334 of the electrode assembly. The distance D may be between about 0.1 mm and about 100 mm. For example, the distance D may be between about 8 mm and about 14 mm. The distance D may control the strength of the electric field provided by the electrode assembly 118 to the first surface 134 and/or the photoresist layer 150. The strength of the electric field controls the rate of diffusion of the charged species 255.

The substrate support assembly 138 has outer side surfaces 348. The electrode assembly 118 has outer side surfaces 328. The distance E represents a rim between the outer side surfaces 328 and the outer side surfaces 348. The distance E may be, for example, any distance suitable for the distance D. The distance E may be constant around the electrode assembly 118, or the distance E may vary. The thickness of the electrode assembly 118 is represented by the distance $T_A$. The distance $T_A$ may be any suitable thickness for the antennas 220, 221 discussed above. As shown, the electrode assembly 118 is coupled to the power supply 174. The properties of the power supplied by the power supply 174 to the electrode assembly 118 may be as described above in relation to the power supply 170 of FIG. 1.

Figure 4A:
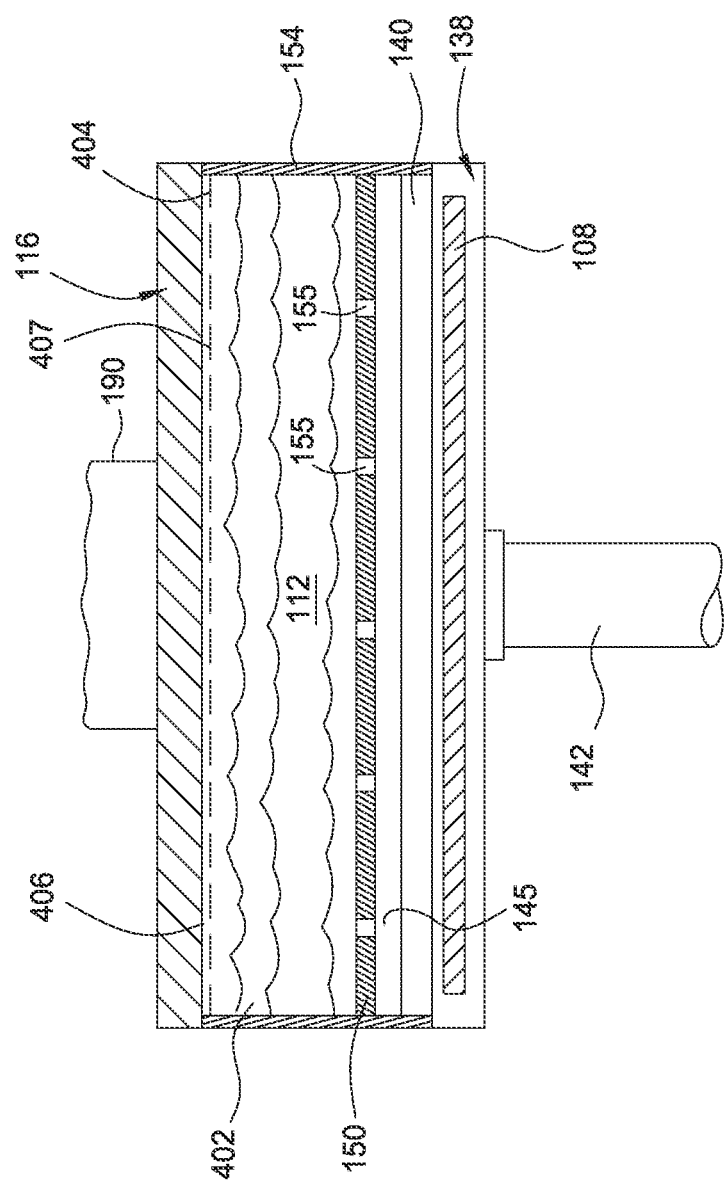
FIGS. 4A-4B are schematic illustration of representations of an intermediate medium that may be used to process a substrate according to the embodiments disclosed herein.

FIG. 4A depicts one example of the substrate support assembly 138 with an intermediate medium 402 disposed in the processing volume 112 and retained by the confinement ring 154 above the substrate 140. Without the intermediate medium 402 positioned in the processing volume 112, an air gap is typically defined in the processing volume 112 between the substrate 140 and the electrode assembly 116. The dimension of the air gap defined in the processing volume 112 may be determined by the distance where the electrode assembly 116 is positioned approximate to the substrate 140. For example, when the electrode assembly 116 is positioned close to the photoresist layer 150 disposed on the substrate 140, a smaller dimension of the air gap may be defined in the processing volume 112. In contrast, when the electrode assembly 116 is positioned relatively far and distanced away from the substrate 140, a larger dimension of the air gap may be defined in the processing volume 112.

It is believed that air medium (i.e., air gap) formed in the processing volume 112 may adversely result in a voltage drop when a voltage power is applied to the electrode assemblies 116, 118. As the dielectric constant in the substrate 140 and in the air are very different, e.g., approximately 11.7 for the substrate 140 and 1 for air, when the voltage supplied to the electric assembly 116 to generated an electric field to the substrate 140, a significant voltage drop is often observed when voltage is transmitting through the air gap formed in the processing volume 112 prior to reaching to the photoresist layer 150 disposed on the substrate 140. It is believed the low dielectric constant in air, e.g., dielectric constant of 1, significantly changes the voltage level applied from the electrode assembly 116. Thus, by inserting a material with relatively high dielectric constant, such as greater than 10, to replace the air gap defined in the processing volume 112, the voltage applied to form the electric field therein may be maintained at a desired level without significant loss until reaching to the photoresist layer 150 disposed on the substrate 140. In one example, intermediate medium 402 placed in the processing volume may be liquid solution, such as DI water, organic gel, inorganic solution, or other suitable medium that has high dielectric constant that can assist maintaining the voltage level transmitting therethrough without significant voltage drop. In one example, DI water, e.g., a material having a dielectric constant about 80, is disposed and placed in the processing volume 112 above the substrate support assembly 138 confined by the confinement ring 154.

In one example, the intermediate medium 402 may be supplied from the intermediate medium source 172 through the intermediate medium dispensing tool 173 to substantially fill the processing volume 112. The intermediate medium 402 disposed in the processing volume 112 may create an interface 404 in a close approximation to a downward surface 406 of the electrode assembly 116. After the intermediate medium source 172 is filled in the processing volume 112, the electrode assembly 116 may be lowered down to keep a minimum or negligible distance 407 between the electrode assembly 116 and the intermediate medium source 172. By doing so, the likelihood of voltage drop caused by the low dielectric constant air gap may be mostly eliminated.

Figure 4B:
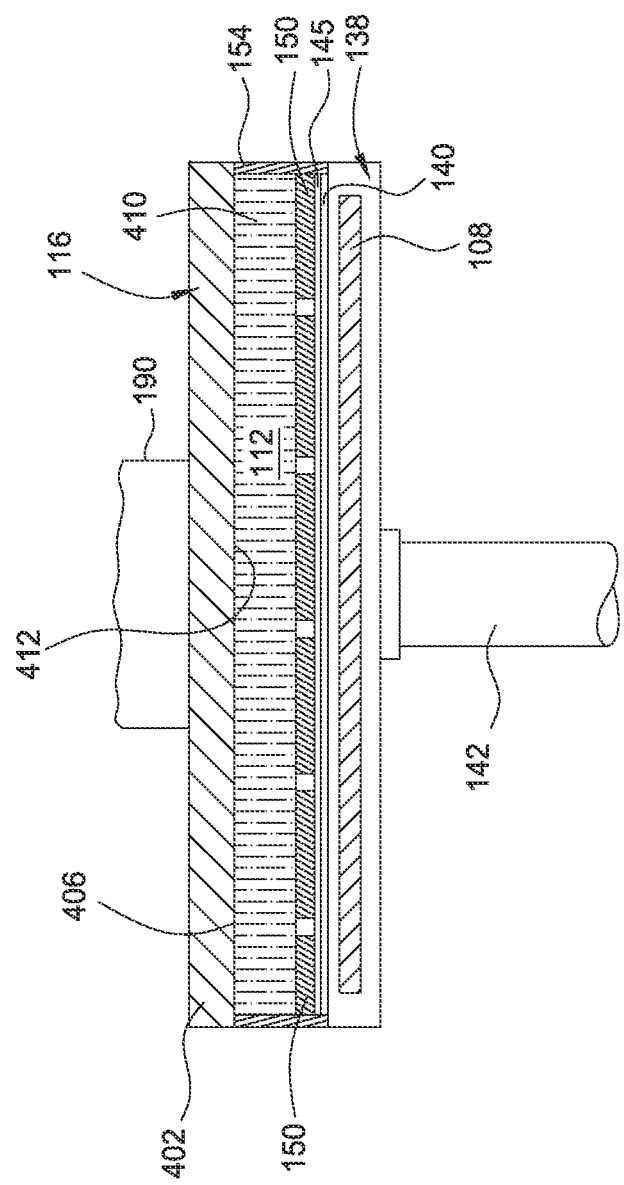

Different materials other than DI water may also be utilized as the intermediate medium source 172 to be filled in the region of the processing volume 112 confined by the confinement ring 154, as shown in FIG. 4B. In the example depicted in FIG. 4B, a gel or flowable organic droplets 410 with a dielectric constant greater than 9 may also be used to fill in the processing volume 112. The gel or flowable organic droplets 410 may be spun-on to the substrate 140 until an interface 412 of the gel or flowable organic droplets 410 is defined in a close approximation to the downward surface 406 of the electrode assembly 116 with minimum and/or negligible room for an air gap. Quantity of the gel or flowable organic droplets 410 needed to fill the processing volume 112 defined above the substrate support assembly 138 confined by the confinement ring 154 depends on the geometry of those components. It is noted that the gel or flowable organic droplets 410 may be continuously added until the processing volume 112 above the substrate is substantially full without leaving an undesired air gap touching the surface of the substrate 140.

Figure 5A:
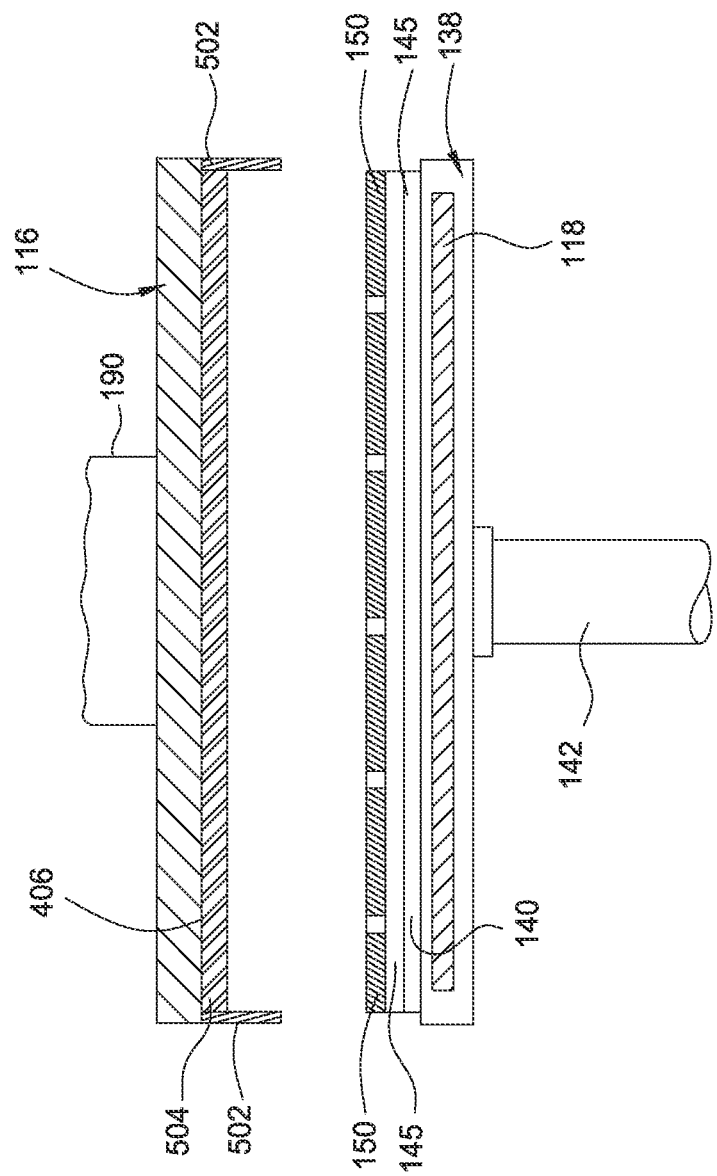
FIGS. 5A-5B are schematic illustration of representations of an intermediate medium that may be used to process a substrate according to the embodiments disclosed herein.
Figure 5B:
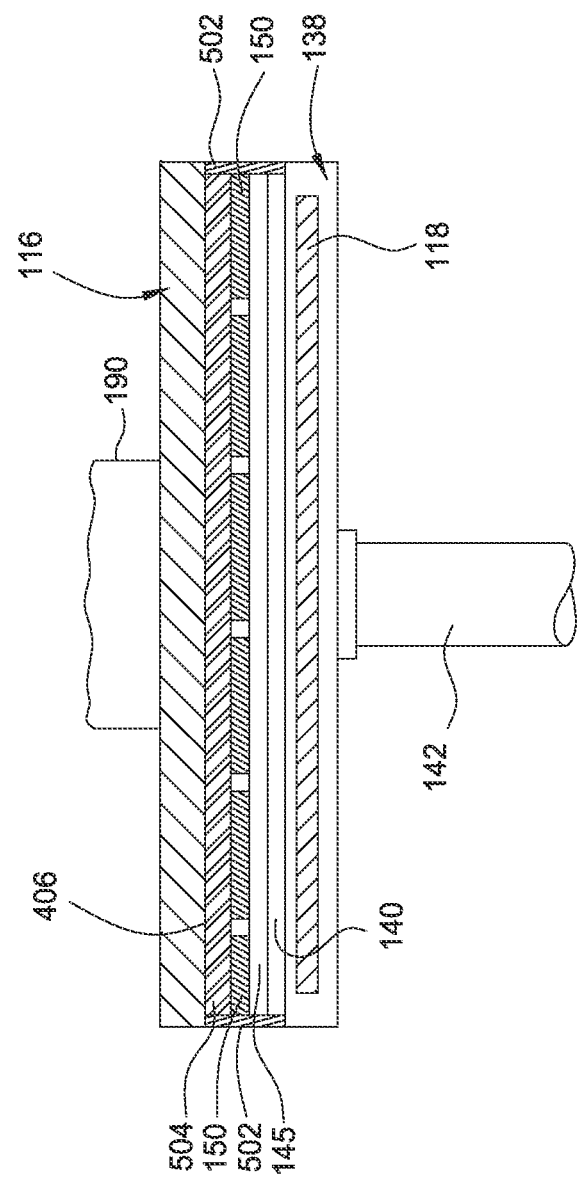

FIG. 5A depicts another embodiment of the electrode assembly 116 with a confinement ring 502 disposed on an edge of the electrode assembly 116 from its downward surface 406. Instead of liquid medium, a solid state medium 504 may be utilized to be positioned below and in contact with the downward surface 406 of the electrode assembly 116 within the area confined by the confinement ring 502. After the solid state medium 504 is in place, the electrode assembly 116 may then be lowered down by the actuator 190 to have the solid state medium 504 in contact with the photoresist layer 150 disposed on the substrate 140, as shown in FIG. 5B. By carefully selecting the qualities and properties of the solid state medium 504, e.g., with desired dielectric constant, the solid state medium 504 serves as a good medium between the electrode assembly 116 and the electrode assembly 118 disposed in the substrate support assembly 138 to maintain the voltage level applied thereto at a desired range for electric field generation. In one example, the solid state medium 504 may be a solid disk having a size that may covers an entire surface of the photoresist layer 150 disposed on the substrate 140. The solid state medium 504 may be attached to the electrode assembly 116 by any suitable techniques, including mechanical bonding or chemical bonding. The solid state medium 504, when positioned above the photoresist layer 150, may be placed in a position confined by the confinement ring 502 in close approximation to the photoresist layer 150 with minimum and/or negligible room for an air gap. It is noted that the phrase "negligible room" as described here may be a space less than 10 micrometer in dimension. In one example, the solid state medium 504 may be fabricated from a material with high dielectric constant greater than 10. Suitable examples of the solid state medium 504 include quartz or $TiO_2$.

Figure 6:
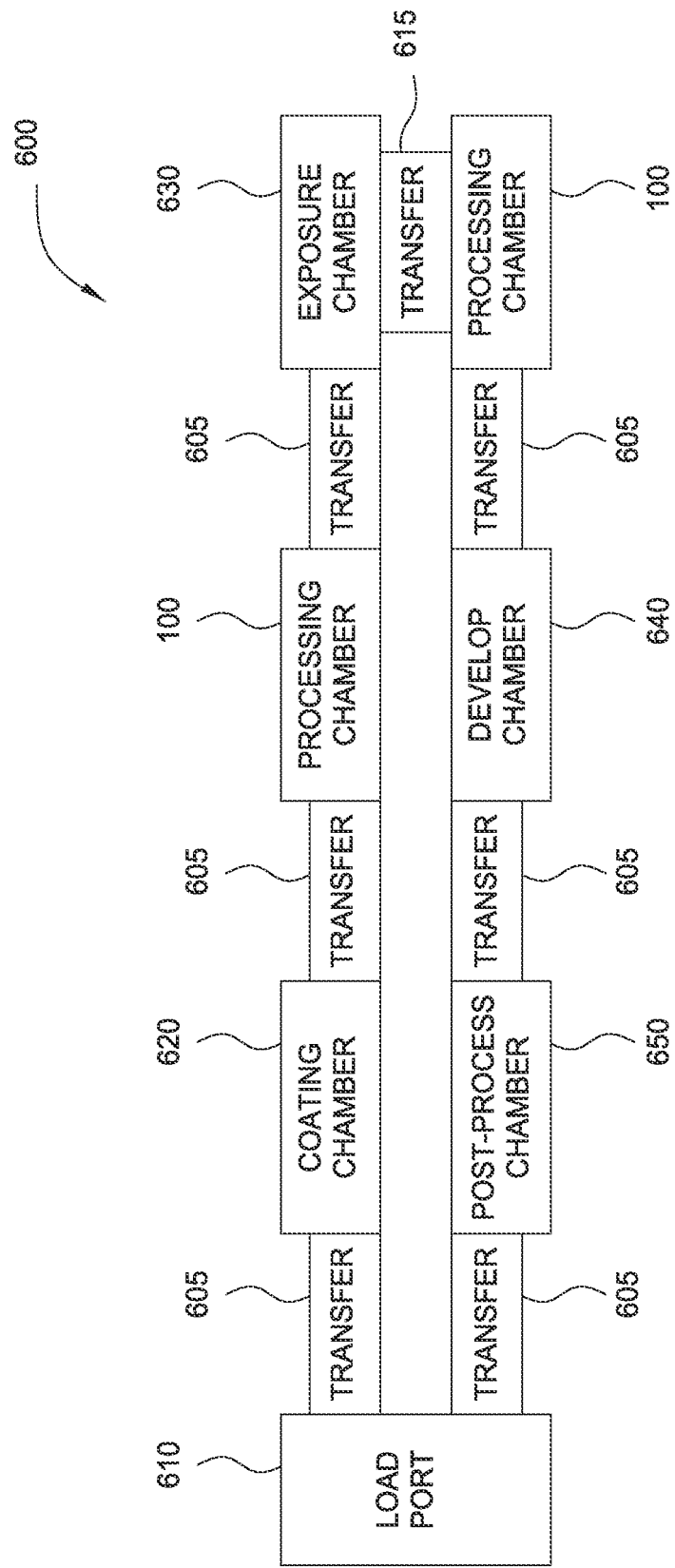
FIG. 6 is a schematic illustration of one representative cluster processing system that may be used to process a substrate according to the embodiments disclosed herein.

FIG. 6 depicts illustrates one representative processing system 600 that may be used to process a substrate according to embodiments disclosed herein. As shown, the processing system 600 includes a load port 610, a coating chamber 620, a processing chamber 100, an exposure chamber 630 (such as a scanner), a second processing chamber 100, a development chamber 640, and a post-processing chamber 650. Each chamber of the processing system 600 is coupled to each adjacent chamber by a transfer chamber 605 or a transfer chamber 615. The transfer chambers 605 and the transfer chamber 615 may be substantially similar or different.

The load port 610 may be used to introduce or remove substrates into or out of the processing system 600. The coating chamber 620 may be used, for example, for applying a photoresist to a substrate. The coating chamber 620 may be, for example, a spin coater. The exposure chamber 630 may be used for exposing the substrate to electromagnetic energy in order to form a latent acid image in a photoresist layer on a substrate. The development chamber 640 may be used, for example, for removing portions of the photoresist layer. The post-processing chamber 650 may be used, for example, to perform a variety of post-processing steps on a substrate. The processing chamber 100 may be used for a pre-exposure bake, a post-exposure bake, and/or other processing steps. As described above, the processing chamber 100 may include one or more electrode assemblies 118, a remote plasma source 160, and magnets 196. However, it is to be understood that the coating chamber 620, the exposure chamber 630, and the development chamber 640 may also be similarly equipped.

Figure 7:
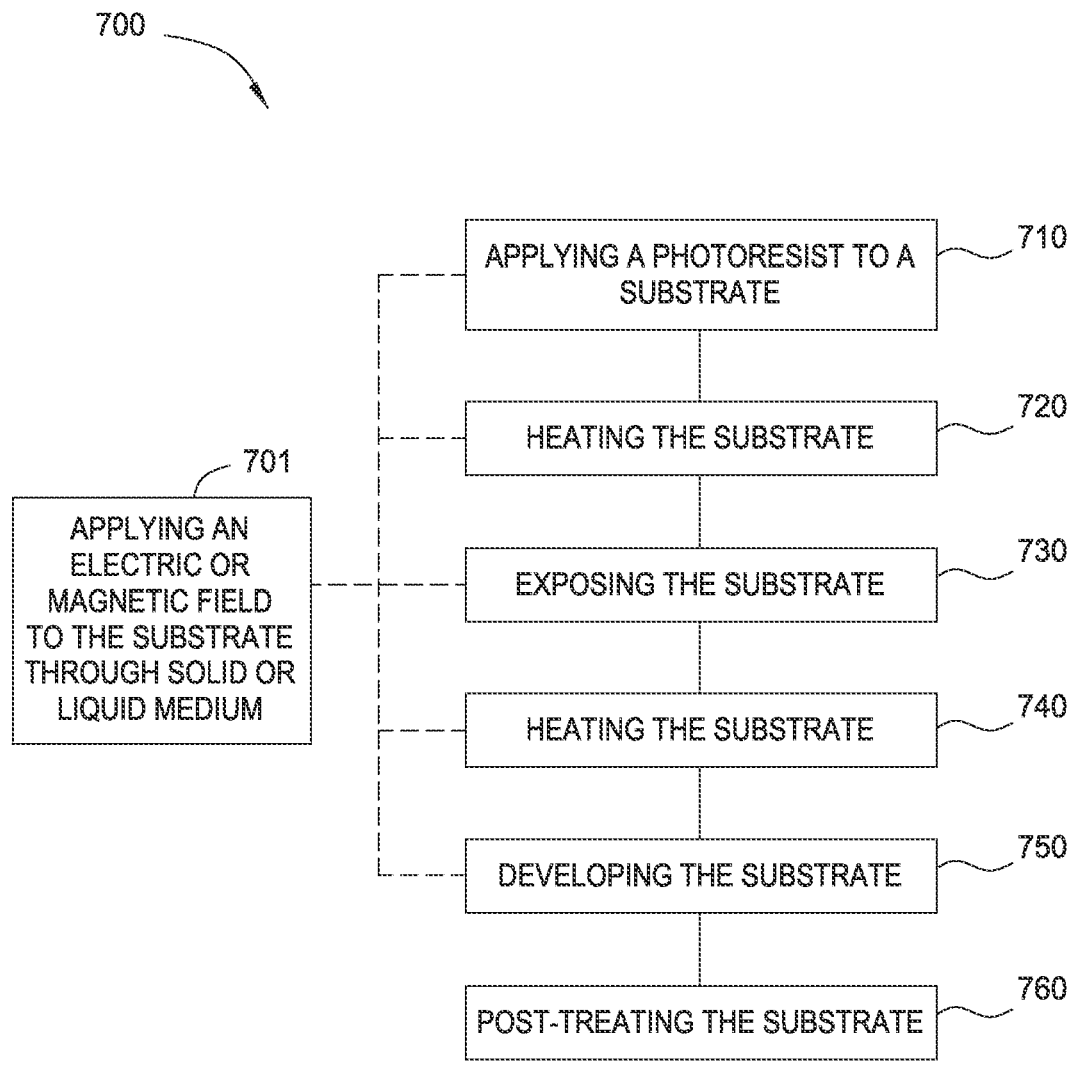
FIG. 7 is a flow diagram of a method of processing a substrate, according to one embodiment.

FIG. 7 is a flow diagram of a representative method 700 for processing a substrate, such as the substrate 140. The method 700 for processing the substrate 140 has multiple stages. The stages can be carried out in any order or simultaneously (except where the context excludes that possibility), and the method can include one or more other stages which are carried out before any of the defined stages, between two of the defined stages, or after all the defined stages (except where the context excludes that possibility). Not all embodiments may include all the stages.

In general, the method 700 starts at operation 710 by applying a photoresist containing a photoacid generator to the substrate 140. At operation 710, a photoresist is applied to the substrate 140 to form a photoresist layer 150. The photoresist layer 150 may be applied by, for example, by spin coating inside a spin coating apparatus, such as the coating chamber 620 included in the processing system 600. In such an embodiment, the substrate 140 may enter the processing system 600 through the load port 610 and thereafter be transferred to the coating chamber 620 through a transfer chamber 605.

The photoresist may include a solvent, a photoresist resin, and a photoacid generator. The photoresist resin may be any positive photoresist resin or any negative photoresist resin. Representative photoresist resins include acrylates, Novolac resins, poly(methylmethacrylates), and poly(olefin sulfones). Other photoresist resins may also be used.

Prior to the photoresist layer 150 exposed to electromagnetic radiation, the photoacid generator generates charged species 255, such as an acid cation and an anion. The photoacid generator may also generate polarized species. The photoacid generator sensitizes the resin to electromagnetic radiation. Representative photoacid generators include sulfonate compounds, such as, for example, sulfonated salts, sulfonated esters, and sulfonyloxy ketones. Other suitable photoacid generators include onium salts, such as aryldiazonium salts, halonium salts, aromatic sulfonium salts and sulfoxonium salts or selenium salts. Other representative photoacid generators include nitrobenzyl esters, s-triazine derivatives, ionic iodonium sulfonates, perfluoroalkanesulfonates, aryl triflates and derivatives and analogs thereof, pyrogallol derivatives, and alkyl disulfones. Other photoacid generators may also be used.

At operation 720, the substrate 140 is then heated by a pre-exposure baking process. During the pre-exposure baking process, the substrate is heated to partially evaporate the photoresist solvents. The pre-exposure bake at operation 720 and the photoresist application at operation 710 may occur in the same chamber or different chambers. For example, both operations 710, 720 may occur in a spin coater or the substrate 140 may be transferred to a different processing chamber. For example, in an embodiment using the processing system 600, the substrate 140 may be transferred from the coating chamber 620 to the processing chamber 100 through the transfer chamber 605.

At operation 730, the substrate 140 then transferred to the exposure chamber 630 to expose substrate 140 to electromagnetic radiation for a lithographic exposure process. The substrate 140 and portions of the photoresist layer 150 are exposed to electromagnetic radiation. During exposure, portions of the photoresist layer 150 are selectively exposed and portions of the photoresist layer 150 are selectively unexposed. Portions of the photoresist layer 150 exposed to electromagnetic radiation may have different chemical properties than the portions of the photoresist layer 150 not exposed to the electromagnetic radiation. The charged species 255 generated by the photoacid generator results in a latent acid image in the resist resin. In some embodiments, a photomask or reticle may be positioned between the photoresist layer 150, and the photoresist layer 150 may be exposed to electromagnetic radiation through the mask or reticle. The mask or reticle may be configured to transfer a pattern containing lines to the photoresist layer 150. In other embodiments, a pattern containing lines may be transferred to the photoresist layer 150 using maskless lithography techniques. The transferred latent image lines 155 may have any desired length, width, and spacing between latent image lines 155. For example, in some embodiments, the line widths and line spacings may be between about 10 nm and about 16 nm. In other embodiments the line widths and spacings may be less than about 10 nm or greater than about 16 nm. In some embodiments, the length of the latent image line 155 is about 150% of the width of the latent image line 155. In other embodiments, the length of the latent image line 155 is greater than about 200% of the width of the latent image line 155, such as for example, greater than about 1000% of the width of the latent image line 155.

The electromagnetic radiation generally has a wavelength suitable for exposing the photoresist layer 150. For example, the electromagnetic radiation may have a wavelength in the extreme ultra violet (EUV) range, such as between about 10 nm and about 124 nm. In other embodiments, the electromagnetic radiation may be generated by an argon fluoride laser. In such an embodiment, the electromagnetic radiation may have a wavelength of about 193 nm. In some embodiments, the wavelength may be 248 nm. Other embodiments may use different wavelengths. In some embodiments, the electromagnetic radiation is from an electron beam or an ion beam.

After exposure, at operation 740, the substrate 140 is heated in a post-exposure bake stage for a post-exposure baking process to change the film properties exposed under electromagnetic radiation at operation 740. The substrate 140 may be transferred from the exposure chamber 630 to the processing chamber 100 through the transfer chamber 615 for the post-exposure baking process. The substrate 140 may be positioned on the first surface 134 of the substrate support assembly 138. The power supply 174 may provide power to the embedded heater 132 to heat the substrate 140. The embedded heater 132 may quickly heat the substrate 140 and the photoresist layer 150. For example, the embedded heater 132 may raise the temperature of the photoresist layer 150 from ambient temperature to between about 70° C. and about 160° C., such as between about 90° C. and 140° C., in less than about 2 seconds.

During the post-exposure bake at operation 740, photoacid generators in the photoresist layer 150 may continue to alter the chemical properties of the exposed portions of the photoresist layer 150. In addition to the baking process, an electrical field may be generated to the photoresist layer 150, as described at operation 701, while performing the post-exposure baking process at operation 740. While applying the electric field between the electrode assembly 116 and/or the electrode assembly 118, the charged species 255 may be guided in a desired direction by at least one of an electric field, a magnetic field, and a plasma. The magnetic field may be generated by, for example, the magnets 196. The plasma may be generated by, for example, the remote plasma source 160. With the utilization of intermediate medium 402, gel or flowable organic droplets 410 or the solid state medium 504 in the processing volume 112, the likelihood of voltage drop/loss applying to the electrode assemblies 116, 118 for electric field generation may be significantly reduced or eliminated. While generating the electric field to the photoresist layer 150, the substrate 140 may or may not have a relative motion to the electrode assemblies 116, 118 as needed to alter the electric field strength at different locations of the photoresist layer 150.

As noted above, the charged species 255 may be guided in any operation or in any combination of operations. In some embodiments, the charged species 255 are guided in one direction relative to the latent image lines 155 in one operation and guided in another direction relative to the latent image lines 155 in another operation. For example, during the exposure operation 730, the charged species 255 may be guided in a direction perpendicular to the first surface 134, and during the post-exposure bake operation 740, the charged species 255 may be guided in the direction of the latent image lines 155 or both in the direction of the latent image lines 155 and in a direction perpendicular to the first surface 134. In another embodiment, the charged species may be guided in the direction of the latent image lines 155 or both in the direction of the latent image lines 155 and in a direction perpendicular to the first surface 134 during the exposure operation 730 and guided in a direction perpendicular to the first surface 134 during the post-exposure bake at operation 740. In some embodiments, the charged species 255 may be guided in different directions within a single phase. For example, in an exposure operation or during a post-exposure bake operation, the charged species 255 may be guided in a direction perpendicular to the first surface 134 for a portion of the stage and guided in a direction perpendicular to the first surface 134 and in a direction along the direction of the latent image lines for a portion of the stage. Such a variation in guided direction may be achieved by toggling the magnetic field on and off while applying a vertical magnetic field.

Subsequently, at operation 750, a development process is performed to the areas exposed or not exposed to electromagnetic radiation from the substrate 140 to develop the photoresist layer. In one embodiment, after operation 740, the substrate 140 is transferred to a develop chamber, such as the develop chamber 640 depicted in FIG. 6. In embodiments using the processing system 600, the substrate 140 may be transferred from the processing chamber 100 to the development chamber 640 through the transfer chamber 605. The development chamber 640 may also include the electrode assembly 116 coupled to one or more power supplies and/or the actuator 190 and magnets 196. The substrate 140 may be positioned in the development chamber 640 relative to the electrode assembly 116 and magnets 196 as described in relation to the coating chamber 620.

During operation 750, the photoresist layer 150 may be developed by, for example, exposing the photoresist layer 150 to a developer, such as a sodium hydroxide solution, a tetramethylammonium hydroxide solution, xylene, or Stoddard solvent. The substrate 140 may be rinsed with, for example, water or n-butylacetate. After the development process at operation 750, the latent image lines 155 may no longer be latent. The lines 155 on the substrate 140 will have less line edge/width roughness compared to conventional techniques.

Subsequently, at operation 760, a post-treatment process may be performed on the substrate 140 to post-treat the substrate after the development process. The post-processing process may be performed, for example, in the post-processing chamber 650 depicted in FIG. 6. In an embodiment using the processing system 600, the substrate 140 may be transferred from the development chamber 640 through the transfer chamber 605 to the post-processing chamber 650 for post-processing. For example, after rinsing, the substrate 140 may be hard baked and inspected. After inspection, an etching process may be performed on the substrate 140. The etching process uses the features of photoresist layer 150, such as the lines 155, to transfer a pattern to the layer 145.

While performing the processes of applying the photoresist layer on the substrate at operation 710, heating the substrate at operation 720, exposing the substrate to electromagnetic radiation at operation 730, heating the substrate at operation 740, developing the substrate at operation 750, and post-treating the substrate at operation 760, a voltage may be applied to generate an electric field, as indicated at operation 701, to guild the charged species 255 generated by the photoacid generator in a desired direction, such as a direction parallel to the x-y plane and in the direction of the latent image lines 155, a direction parallel to the x-y plane and perpendicular to the latent image lines 155, a different direction, or combinations thereof. With the intermediate medium 402, the gel or flowable organic droplets 410 or the solid state medium 504 placed in between the electrode assembly 116 and the substrate 140 to avoid possible air gap defined therebetween, voltage applied thereto to generate the electric field may then be maintained at a desired level without undesired voltage drop or loss.

The previously described embodiments have many advantages, including the following. For example, the embodiments disclosed herein may reduce or eliminate voltage drop/loss while applying an electric field between an electrode assembly and a photoresist layer disposed on a substrate for line edge/width roughness reduction. The reduction or elimination of voltage drop/loss may be obtained by utilizing intermediate medium 402, a gel or flowable organic droplets 410 or a solid state medium 504 placed in between the electrode assembly 116 and the substrate 140 to avoid possible air gap defined therebetween. The aforementioned advantages are illustrative and not limiting. It is not necessary for all embodiments to have all the advantages.

While the foregoing is directed to embodiments of the present disclosure, other and further embodiments of the disclosure may be devised without departing from the basic scope thereof, and the scope thereof is determined by the claims that follow.

What is claimed is:

1. An apparatus for processing a substrate, the apparatus comprising:
    a processing chamber, the processing chamber comprising:
    a substrate support having a substrate supporting surface;
    a heat source embedded in the substrate support configured to heat a substrate positioned on the substrate supporting surface;
    an electrode assembly configured to generate an electric field in a direction substantially perpendicular to the substrate supporting surface, wherein the electrode assembly is positioned opposite the substrate supporting surface having a downward surface facing the substrate supporting surface, wherein the electrode assembly is spaced apart from substrate support defining a processing volume between the electrode assembly and the substrate supporting surface; and
    a confinement ring disposed on an edge of the substrate support or the electrode assembly configured to retain an intermediate medium, wherein the intermediate medium has a dielectric constant greater than 10.

2. The apparatus of claim 1, wherein the intermediate medium is configured to be disposed in the processing volume.

3. The apparatus of claim 1, wherein the intermediate medium positioned in the processing volume is in close approximation to the substrate supporting surface and the downward surface of the electrode assembly.

4. The apparatus of claim 1, wherein the processing chamber is coupled to a remote plasma source.

5. The apparatus of claim 1, further comprising:
    an intermediate medium dispensing tool disposed in the processing chamber configured to dispense the intermediate medium in the processing volume.

6. The apparatus of claim 1, wherein the intermediate medium is DI water.

7. The apparatus of claim 1, wherein the intermediate medium is a solid state medium.

8. The apparatus of claim 1, wherein the intermediate medium is quartz.

9. The apparatus of claim 1, wherein the intermediate medium is substantially filled in the processing volume defined between the electrode assembly and the substrate supporting surface without air gap.

10. The apparatus of claim 1, wherein the confinement ring disposed on the edge of the electrode assembly is configured to retain the intermediate medium when the electrode assembly is actuated to a processing position.

11. An apparatus for processing a substrate, the apparatus comprising:
    a processing chamber, the processing chamber comprising:
    a substrate support comprising a substrate supporting surface;
    an electrode assembly comprising a first electrode disposed in the substrate support and a second electrode positioned opposite the substrate supporting surface, the first and the second electrodes defining a processing volume inbetween configured to generate an electric field in a direction substantially perpendicular to the substrate supporting surface; and
    an intermediate medium positioned in the processing volume, wherein the intermediate medium has a dielectric constant greater than 10.

12. The apparatus of claim 11, further comprising:
    a heating element disposed in the substrate support.

13. The apparatus of claim 11, further comprising:
    an intermediate medium dispensing tool disposed in the processing chamber configured to dispense the substance or liquid medium in the processing volume.

14. The apparatus of claim 11, further comprising:
    a confinement ring disposed on an edge of the substrate support or an edge of the second electrode configured to retain the intermediate medium.

15. The apparatus of claim 11, wherein the intermediate medium is DI water.

* * * * *